United States Patent [19]

Dueber

[11] Patent Number: 4,504,566
[45] Date of Patent: Mar. 12, 1985

[54] SINGLE EXPOSURE POSITIVE CONTACT MULTILAYER PHOTOSOLUBILIZABLE LITHO ELEMENT WITH TWO QUINONE DIAZIDE LAYERS

[75] Inventor: Thomas E. Dueber, Wilmington, Del.

[73] Assignee: E. I. Du Pont de Nemours and Company, Wilmington, Del.

[21] Appl. No.: 623,130

[22] Filed: Jun. 22, 1984

Related U.S. Application Data

[63] Continuation-in-part of Ser. No. 438,713, Nov. 1, 1982, abandoned.

[51] Int. Cl.³ .................. G03C 1/495; G03C 1/60; G03C 1/54
[52] U.S. Cl. .................. 430/156; 430/5; 430/145; 430/165; 430/166; 430/192; 430/294; 430/300; 430/309; 430/323; 430/326
[58] Field of Search .................. 430/156, 5, 145, 165, 430/166, 192, 258, 259, 260, 261, 263, 294, 300, 309, 323, 326

[56] References Cited

U.S. PATENT DOCUMENTS

| | | | |
|---|---|---|---|
| 3,458,311 | 7/1969 | Alles | 96/35.1 |
| 3,634,082 | 1/1972 | Christensen | 96/33 |
| 3,837,860 | 9/1974 | Roos | 96/91 |
| 3,890,148 | 6/1975 | Lawson et al. | 430/5 |
| 3,900,325 | 8/1975 | Christensen et al. | 96/91 |
| 4,093,464 | 6/1978 | Ruckert et al. | 96/91 |
| 4,123,272 | 10/1978 | Quinn | 96/35.1 |
| 4,173,673 | 11/1979 | Bratt et al. | 478/217 |
| 4,217,407 | 8/1980 | Watanabe et al. | 430/166 |
| 4,238,559 | 12/1980 | Feng et al. | 430/156 |
| 4,260,673 | 4/1981 | Krech | 430/143 |
| 4,311,784 | 1/1982 | Fan | 430/271 |
| 4,337,308 | 6/1982 | Franke | 430/306 |
| 4,349,620 | 9/1982 | Cyr et al. | 430/259 |
| 4,353,978 | 10/1982 | Leberzammer et al. | 430/302 |
| 4,370,405 | 1/1983 | O'Toole et al. | 430/312 |
| 4,378,264 | 3/1983 | Pilette | 430/270 |
| 4,405,394 | 9/1983 | Cohen | 430/319 |
| 4,409,115 | 10/1983 | Sondergeld | 252/79.1 |

FOREIGN PATENT DOCUMENTS

| | | | |
|---|---|---|---|
| 1493833 | 11/1977 | United Kingdom | 430/160 |
| 1493834 | 11/1977 | United Kingdom | 430/160 |

*Primary Examiner*—Charles L. Bowers, Jr.

[57] ABSTRACT

Multilayer photosolubilizable litho element comprising (1) support, (2) photosolubilizable dye or pigment-containing layer having an optical density in the visible region of the spectrum of at least 2.0 comprising a quinone diazide and at least one acidic polymeric binder, and (3) photosolubilizable layer comprising a quinone diazide compound and at least two acidic polymeric binders having carboxylic acid substituents, one binder having an acid number below 110, preferably poly(methylmethacrylate/methacrylic acid). The element is useful as a single exposure positive contact litho film.

9 Claims, No Drawings

SINGLE EXPOSURE POSITIVE CONTACT MULTILAYER PHOTOSOLUBILIZABLE LITHO ELEMENT WITH TWO QUINONE DIAZIDE LAYERS

CROSS REFERENCE TO RELATED APPLICATION

This is a continuation-in-part of application Ser. No. 438,713, filed Nov. 1, 1982 abandoned.

DESCRIPTION

1. Technical Field

This invention relates to photosolubilizable litho elements. More particularly this invention relates to multilayer photosolubilizable litho elements having at least one quinone diazide compound in each layer.

2. Background Art

Photosensitive elements are known which are useful as contact speed lithographic films. Bratt and Cohen U.S. Pat. No. 4,173,673 discloses a photopolymerizable litho element wherein the photopolymerizable layer has an optical density of at least 3.0 in the visible region of the spectrum and a maximum thickness of 0.015 mm. This element can undergo "dot-etching" which is a reduction in the size of or "etching" the halftone dot formed when the element is exposed to actinic radiation through a halftone screen and developed. While the element has advantages over silver halide containing materials, it has some disadvantages. The presence of pigment or dye in the photopolymerizable layer in the amount required to give an optical density of at least 3.0 can cause an increase in exposure time as well as have an effect on the photopolymerizable layer.

Two layer photosensitive solvent-processable litho elements are known from Fan U.S. Pat. No. 4,311,784 wherein one of the layers is nonphotosensitive. In such an element the nonphotosensitive layer which is present below a clear photosensitive layer can have a maximum thickness of 0.015 mm and contains a quantity of pigment or dye in an amount to provide an optical density in the visible region of the spectrum of at least 3.0. The photosensitive layer can be photohardenable or photosolubilizable, the latter type containing an o-quinone diazide compound. While useful in making dot-etched, contact litho negatives or positives, it has been found that the elements upon aging lose some speed and contrast.

An object of this invention is to provide a multilayer photosolubilizable litho element which has a long shelf life and good contrast. Another object of this invention is to provide a photosolubilizable litho element wherein the unexposed photosensitive image areas have reduced solubility in aqueous developers, and the exposed photosensitive image areas have increased solubility in aqueous developers.

DISCLOSURE OF THE INVENTION

In accordance with this invention there is provided a multilayer photosolubilizable litho element comprising, in order on a support, (1) a photosolubilizable solvent-soluble dye or pigment-containing layer, 0.0025 to 0.0064 mm in thickness, comprising at least one photosolubilizable quinone diazide compound in an amount of 4 to 40% by weight based on the dry weight of the layer, at least one acidic polymeric binder in an amount of 20 to 60% by weight based on the dry weight of the layer, and dye or pigment in an amount up to 50% by weight based on the dry weight of the layer, the layer having an optical density of at least 2.0 in the ultraviolet region of the spectrum, and (2) a clear photosolubilizable layer, 0.0013 to 0.005 mm in thickness, comprising 10 to 80% by weight based on the dry weight of layer of at least one photosolubilizable quinone diazide compound, and 20 to 90% by weight based on the dry weight of the layer of at least two polymeric binders having carboxylic acid substituents, one of said binders having an acid number below 110 and any other binder having an acid number below 300.

The multilayer photosolubilizable litho element differs from previous elements in that it has at least one quinone diazide compound in each layer, and the polymeric binders in the upper photosensitive layer are selected to improve solubility in aqueous developers of the exposed image areas and to reduce solubility in aqueous developers of the unexposed image areas.

An essential ingredient which is present in both the lower dye or pigment-containing layer and the upper photosolubilizable layer is a quinone diazide compound. At least one quinone diazide can be present in each layer. The quinone diazide is present in the upper photosensitive layer in an amount of about 10 to 80% by weight, preferably 20 to 40% by weight, based on the dry coating weight of the layer. The amount by weight of quinone diazide compound in the dye or pigment-containing lower layer is 4 to 40% by weight, preferably 10 to 20% by weight, based on the dry coating weight of the layer. Preferably a quantity of at least 10% by weight of quinone diazide in the bottom layer significantly reduces a loss in photospeed and developability that would otherwise occur due to migration of quinone diazide into a bottom layer that contains no quinone diazide. Suitable quinone diazide compounds include those of the formula:

Compound $Ar_1SO_2-OCH_2CH_2OCH_2CH_2OnBu$

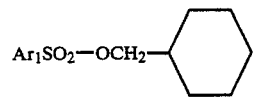

$Ar_1SO_2OCH_2CH_2OCH_2CH_2OCH_2CH_2OSO_2Ar_1$
$Ar_2SO_2OCH_2CH_2OCH_2CH_2OnBu$
$Ar_1SO_2O(CH_2CH_2O)_3CH_2CH_2OSO_2Ar_1$

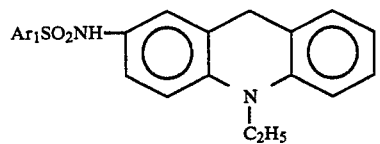

$Ar_1SO_2(OCH_2CH_2)_2OSO_2Ar_1$
$Ar_1SO_2(OCH_2CH_2)_{6.4}OSO_2Ar_1$
$Ar_1SO_2O(CH_2)_6OSO_2Ar_1$
$Ar_1SO_2OCH_2CH_2OCH_3$
$Ar_1SO_2OCH_2CH_2OnBu$
$Ar_1SO_2OCH_2CH_2OCH_2CH_2OCH_3$
$Ar_1SO_2OCH_2CH_2CH_2OSO_2Ar_1$
$Ar_1SO_2O(CH_2)_5OSO_2Ar_1$
$Ar_1SO_2O(CH_2)_5CH_3$

Ar$_1$SO$_2$O(CH$_2$)$_7$CH$_3$
(Ar$_1$SO$_2$OCH$_2$CH$_2$CH$_2$CH$_2$)$_2$
(Ar$_1$SO$_2$OCH$_2$CH$_2$CH$_2$CH$_2$CH$_2$)$_2$

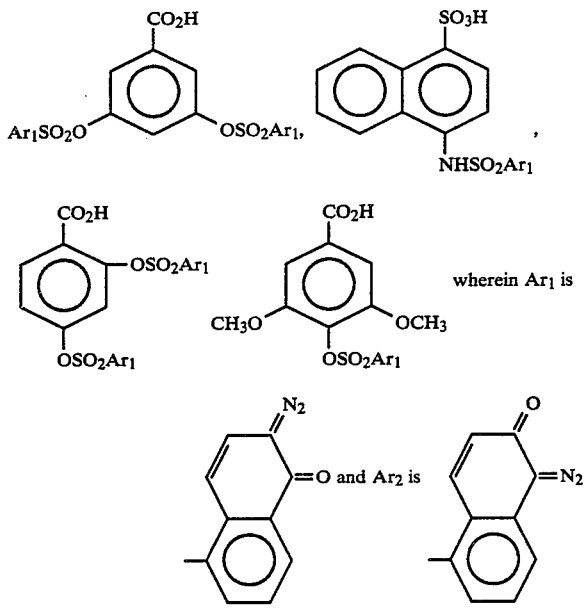

Another essential ingredient present in the lower dye or pigment-containing layer and upper photosolubilizable layer is at least one acidic organic polymeric binder. The molecular weights of the binders and other polymers are expressed as weight average molecular weights ($\overline{M}w$). Such molecular weights can be determined by using a light scattering technique using known standard samples, e.g., polystyrene, polymethacrylic acid, polymethylmethacrylate, etc., as known to those skilled in the art.

In the upper layer generally at least two or three binders are present. The total weight of acidic organic polymeric binders in the upper layer is 20 to 90% by weight based on the dry weight of the layer, preferably 60 to 80% by weight. Various combinations of binders are disclosed in the Examples below. Various binders are useful to aid nonexposed image areas from dissolving in developer. Illustrative of such polymeric binders which have relatively low acid numbers of below about 110, preferably 5 to 60 are: methylmethacrylate(92)/methacrylic(8) acid copolymers including those copolymers with acid numbers of about 60 and $\overline{M}w$ of 70,000; methymethacrylate(98)/methacrylic acid (2) acid number 9, $\overline{M}w$ of 25,000, glass transition temperature (Tg) of 106° C.; methylmethacrylate(69)/n-butyl methacrylate(29)/methacrylic acid(2) terpolymer, acid number 5, $\overline{M}w$ of 25,000, Tg of 74° C., methylmethacrylate(30)/butyl acrylate(25)/methacrylic acid(15)/acrylonitrile(30), acid number 105, $\overline{M}w$ of 150,000; vinyl chloride(81)/vinyl acetate(17)/maleic acid (2) terpolymer, acid number 26; vinyl chloride (83)/vinyl acetate (16)/maleic acid (1) terpolymer, acid number 11; vinyl acetate(95)/crotonic acid(5) copolymer, acid number 38, $\overline{M}w$ of greater than 30,000. Other copolymers of similar type known to those skilled in the art can also be used in the upper layer. Preferably poly(methylmethacrylate/methacrylic acid is present in the upper layer. A useful range of a specific binder described above based on the total dry weight of the layer is 5 to 25% by weight, preferably 10 to 20% by weight.

Additional acidic polymeric binders can be present in the upper layer as film formers wherein the acid number ranges from about 35 to about 300. Such polymers also assist in achieving rapid development or washout rate in aqueous developers. One type of polymer is 1.4 to 1 copolymer of styrene/maleic anhydride esterified with a butanol mixture, acid number 190, $\overline{M}w$ of 10,000; 1 to 1 copolymer of styrene/maleic anhydride esterified with isobutanol, acid number 180, $\overline{M}w$ of 20,000, etc. This polymer type is present in 0 to 75% by weight based on the total weight of quinone diazide and binder, preferably 40 to 50% by weight. A second type of polymer is ethyl acrylate(56)/methyl methacrylate(37)/acrylic acid(7)terpolymer, acid number 60–65, $\overline{M}w$ of 7,000. This polymer type is present in 0 to 25% by weight based on the total weight of quinone diazide and binder, preferably 5 to 20% by weight. Other known polymers of similar types and properties known to those skilled in the art are also useful.

In the lower dye or pigment-containing layer preferably at least one acidic polymeric binder is present. A useful polymeric binder is ethyl acrylate (56)/methyl methacrylate (37)/acrylic acid (7), acid number 76–85, $\overline{M}w$ of 260,000. This polymer type is present in 20 to 60% by weight based on the total dry weight of the layer, preferably 30 to 50% by weight. Other known polymers of similar type and properties known to those skilled in the art are also useful in the lower layer.

A preferred element of the invention has layer (1) which comprises 10 to 20 parts by weight quinone diazide compound and 80 to 90 parts by weight mixture of dye or pigment and ethyl acrylate/methyl methacrylate/acrylic acid terpolymer and layer (2) which comprises 20 to 40 parts by weight of quinone diazide compound, 40 to 50 parts by weight of styrene/maleic anhydride copolymer esterified with a butanol mixture, 5 to 20 parts by weight of ethyl acrylate/methyl methacrylate/acrylic acid copolymer and 10 to 20 parts by weight of poly(methylmethacrylate/methacrylic acid).

Additional ingredients which may be present in the upper photosolubilizable layer include waxes to provide increased durability (scratch resistance) and plasticizers. Useful waxes include: aqueous dispersion of polyethylene (40% by weight); low melting polyvinyl ether wax, melting point 53°–54° C., saponification value 76–80, specific gravity at 20° C. of 0.94; polyethylene beads, e.g., particle size 7.5 m$\mu$ extra hard grade of colorless synthetic wax, high melting 235°–245° F. (113°–119° C.) synthetic hydrocarbon wax; pentaerythritol ester of grape seed fatty acid, acid number 26.6, saponification value 178.36 (Dura Commodities Corp., Harrison, N.Y.). Other waxes known to those skilled in the art can be used. The waxes can be present in 0 to 40% by weight based on the weight of the upper photosolubilizable layer.

Suitable optional plasticizers present in the upper photosolubilizable layer include: a mixture of triethylene glycol dicaprate and triethylene glycol dicaprylate, specific gravity 0.96 viscosity is 15 cps at 25° C., tricresyl phosphate, dioctyl phthalate, dibutyl phthalate, butyl benzyl phthalate, triethylene glycol diacetate, etc. Plasticizers are generally present in an amount of 0 to 10% by weight based on the weight of the upper photosolubilizable layer.

To achieve better coating uniformity of the layers known surfactants and coating aids can be present in either or both of the layers. Suitable surfactants are illustrated in the examples below, e.g., polyethylene oxide, $\overline{M}w$ of ca. 400,000, FC 128 ® anionic and FC 430 ® nonionic fluorocarbon surfactants sold by 3M Company.

The lower layer has incorporated therein dyes or pigments which provide an optical density of at least 2.0, preferably 3.0 or more, throughout the ultraviolet region of the spectrum, i.e., up to 50% by weight based on the dry weight of the layer. Preferably the element has an optical density of at least 2.0 in the visible region of the spectrum. This frequently requires a high percentage of dyes and/or pigments, usually between 25 to 50% by weight, of the layer. The dyes or pigments should not migrate into the upper photosolubilizable layer or loss of photospeed will occur. Colloidal carbon is a particularly preferred pigment, e.g., a furnace black with a mean diameter of $0.075\mu$ with a surface area of 25 sq meters/g. A number of dyes, U.V. absorbers, and pigments may be used either individually or in combination to produce visibly opaque layers provided they are not migratory as noted above. Additional pigments which are useful are as follows:

Primrose Yellow Color Index #77603 (Pigment)
Chrome Yellow Light Color Index #77603 (Pigment)
Chrome Yellow Medium Color Index #77600 (Pigment)
Dispersed manganese dioxide
Dispersed Cobalt Aluminate
Toluidine Yellow GW Color Index #71680 (Pigment)
Molybdate Orange Color Index #77605 (Pigment)
Dalamar Yellow Color Index #11741 (Pigment)
Green Gold Color Index #12775 (Pigment)
Graphtol Yellow Color Index Pigment Yellow #61
Graphtol Orange Color Index Pigment Orange #13.

The components of the above layers are expressed in percent by weight based on the dry weight of the layer. It is understood that the above amounts can be adjusted so that the total dry weight of the layer including minor components will amount to 100% based on the dry weight of the layer.

The above layers are present on a support. Suitable supports include: films composed of high polymers, which are cast as films from molten polymer, such as polyamides, e.g., polyhexamethylene sebacamide, polyhexamethylene adipamide; polyolefins, e.g., polypropylene; polystyrene, polyacrylonitrile; and cellulosics, e.g., cellulose acetate, cellulose acetate/butyrate, cellophane. A particularly preferred support material is polyethylene terephthalate film of the kind described in Alles et al., U.S. Pat. No. 2,627,088, and Alles, U.S. Pat. No. 2,779,684, with or without the surface coating described in the former patent. The support may have a resin "sub" or other layer thereon which may or may not be soluble and which for purposes of this invention is considered part of the support. However, the total thickness of the contiguous layer and any soluble sub or underlayer should not exceed 0.0006 inch (0.015 mm). By "soluble" is meant solubility in a solvent in which the pigment or dye-containing layer is developable. Preferred soluble sub layers have a thickness not exceeding about 0.0002 inch (0.005 mm).

The litho element can be prepared in many ways. As exemplified in the Examples below, the upper, clear photosolubilizable layer/lower pigment or dye-containing layer can be coated as aqueous/solvent, aqueous/aqueous, solvent/solvent and laminating a solvent coated layer/solvent coated layer. Aqueous/solvent coatings are preferred. Any solvent may be used to coat the solvent coatings as long as it does not cause mixing of the components of the layer with the components of the adjacent layer when the two layers are coated simultaneously and the solvent is effectively removed on drying the film. Standard coating apparatus and processes can be used and are not part of this invention. The coating weight of the clear upper layer ranges from about 10 to 100 $mg/dm^2$, 15 to 40 $mg/dm^2$ being a preferred coating weight. The dry coating thickness is from 0.00005 to 0.0002 inch (0.0013 to 0.005 mm). The coating weight of the pigment and dye-containing lower layer ranges from 10 to 500 $mg/dm^2$ with the lower weight being limited by the desired optical density of the layer. A preferred coating weight for this layer is 20 to 50 $mg/dm^2$. The dry coating thickness is from 0.0001 to 0.00025 inch (0.0025 to 0.0064 mm).

The multilayer photosolubilizable element is capable of producing a litho image by a single exposure, e.g., through a halftone dot image, washing out the exposed image areas of the clear photosolubilizable upper layer and the lower pigment or dye-containing layer with an aqueous solution which may include agitation in a bath with the aid of mechanical action such as brushing or spraying. Known aqueous solutions can be used for development, e.g., those disclosed in Alles U.S. Pat. No. 3,475,171, which is incorporated by reference. The lower layer provides an opaque layer, i.e., having an optical density greater than 2.0, preferably 3.0 or more, in the ultraviolet region of the spectrum. The washed out images can be dot-etched by a process of undercutting the image areas by means of mechanical action such as spraying, brushing or rubbing. Dot-etching is reducing the size of, or etching the halftone dots, thereby changing the tone values of the image. The procedure of dot-etching is described in Bratt and Cohen U.S. Pat. No. 4,229,520 which is incorporated by reference. A preferred mode is illustrated in Example 1 wherein the upper layer is aqueous coated and the lower layer is solvent coated.

INDUSTRIAL APPLICABILITY

The photosensitive elements of this invention are useful as single exposure nonsilver positive contact litho films that can be handled under yellow light conditions. The elements are oxygen insensitive and have excellent exposure latitude. Development is with dilute aqueous alkaline developer solutions. Still other uses are for preparing colored images from color separation negatives suitable for color-proofing.

EXAMPLES

The following examples illustrate the invention wherein the parts and percentages are by weight. The molecular weights of the polymeric binders are expressed as weight average molecular weights. Acid numbers are determined in the examples by: accurately weigh approximately 1.0 g of thoroughly dry product into a 250 cc Erlenmeyer flask, add approximately 50 cc ethanol and shake or heat to dissolve the polymer. Add about 10 drops phenolphthalein solution and titrate with 0.1N NaOH in methanol. Run duplicate samples.

EXAMPLE 1

Lower Coating

A black coating solution (10.4% solids) was prepared by adding to 2976 g of a 25% solids methylene chloride solution of a roll milled dispersion of carbon black, furnace black having mean diameter 0.075μ with surface area of 25 sq meters/g (45)/terpolymer (55) acid No. 76–85, $\overline{M}w$ ca. 260,000 the following ingredients in the amounts indicated:

| Ingredient | Amount (g) |
|---|---|
| Methylene chloride | 1348.0 |
| Chlorothene | 3726.0 |
| Ethyl Cellosolve | 548.0 |
| Butyl carbitol 2-diazo-1-naphthol-5-sulfonate | 163.31 |
| FC-430 ® nonionic fluorocarbon surfactant, 3M Co., St. Paul, Minn., 10% methylene chloride solution | 25.0 ml |
| Polyethylene oxide, $\overline{M}w$ ca. 400,000 suspended in 100 g of ethyl Cellosolve | 18.0 |

The solution was coated on resin subbed polyethylene terephthalate film 0.004 inch (0.10 mm) in thickness with an extrusion die coater at 100 ft/min (30.48 m/min) with 93° C. forced air drying in a 32 foot (9.75 m) long dryer to give a dry weight of 40 mg/dm² (optical density was 4.1 is visible region of spectrum and 4.0 in ultraviolet region of the spectrum.

Upper Coating

A clear coating solution was prepared by mixing the following ingredients in the amounts indicated:

| | Ingredient | Amount (g) |
|---|---|---|
| A. | Methyl methacrylate (92)/methacrylic acid (8) copolymer, acid No. 60, softening point 96° C., $\overline{M}w$ 70,000 | 1176.5 |
| B. | Styrene/maleic anhydride, ratio 1.4:1 copolymer esterified with a butanol mixture, acid No. 190, $\overline{M}w$ 10,000, 10% aqueous. | 2160.0 |
| C. | Ethyl acrylate (56)/methyl methacrylate (37)/acrylic acid (7) terpolymer, acid No. 60–65, $\overline{M}w$ 7000, 20% aqueous | 675.0 |
| | Polyethylene aqueous dispersion (40%) | 562.5 |
| | Distilled water | 1128.8 |

Ingredient A was prepared by adding 270 g of approximately 44% solids of the copolymer in ethyl Cellosolve to a solution of 864 ml distilled water and 27 ml conc. ammonium hydroxide at 60° C. The solution was then diluted to 9.18% solids.

Ingredient B was prepared by stirring 216 g of the copolymer into a solution of 71.9 g conc. ammonium hydroxide and 1872.1 g distilled water.

Ingredient C was prepared by mixing 135 g of the terpolymer with 25.3 g conc. ammonium hydroxide and 514.7 g distilled water.

To the clear coating solution (pH 9.4) made up from the above solutions was added 216 g of 2,4-dihydroxybenzoic acid bis(2-diazo-1-naphthol-5-sulfonate) with stirring at 50° C. At room temperature (pH 8.2) with rapid stirring a 127 ml solution of 25.4 g ammonium carbonate, 142.8 ml distilled water, 14.4 g zinc oxide and 17.4 g ammonium hydroxide was added dropwise over 2 hours. The final pH was 8.8. 77.4 g of a 5% aq. solution of FC-128 ® anionic fluorocarbon surfactant from 3M Co., St. Paul, Minn. was then added. The clear coating solution was extrusion die coated at 30 ft/min (9.14 m/min) on the black layer at 28 mg/dm² with 105°–112° C. forced air drying in a 32 foot (9.75 m) long dryer.

The dry film was placed in a vacuum frame and was exposed with a 4 Kw pulsed xenon lamp positioned 5 feet (1.52 m) from the vacuum frame for 1 minute. The exposed film was developed in a Crona-Lite ® processor. E. I. du Pont de Nemours and Company, Wilmington, DE, with a developer solution prepared from 84 g potassium carbonate 1.5 hydrate, 5 g potassium hydrogen carbonate and 1536 g distilled water at 72° F. (21° C.) and a 40 psi (2.81 kg/sq cm) spray water rinse at 90° F. (32° C.). The film duplicated 2–98% dots on a 150 line screen target.

EXAMPLE 2

A black coating solution was prepared from the following ingredients:

| Ingredient | Amount (g) |
|---|---|
| 2,4-Dihydroxybenzoic acid bis(2-diazo-1-naphthol-5-sulfonate) | 72.0 |
| 3,5-Dihydroxybenzoic acid bis(2-diazo-1-naphthol-5-sulfonate) | 72.0 |
| Distilled water | 2047.0 |
| Ammonium hydroxide (conc.) | 28.8 |

The quinone diazides were added to the above solution at 50° C. and the solution was then cooled to room temperature. After standing overnight the solution was added slowly at room temperature to a solution of 756 g of a roll milled dispersion of carbon black in terpolymer described in Example 1 dissolved in 3024 g distilled water and enough ammonium hydroxide to make a clear solution. The solution was extrusion die coated at 30 ft/min (9.14 m/min) on resin subbed polyethylene terephthalate film at 34 mg/dm² with 105°–112° C. forced air drying in a 32 foot (9.75 m) long dryer. The optical density in the regions of the spectrum were: 4.2 visible, 4.5 ultraviolet.

A clear coating solution was prepared from the following ingredients:

| Ingredient | Amount (g) |
|---|---|
| 2,4-Dihydroxybenzoic acid bis(2-diazo-1-naphthol-5-sulfonate) | 108.0 |
| 3,5-Dihydroxybenzoic acid bis(2-diazo-1-naphthol-5-sulfonate) | 108.0 |
| Ingredient A described in Ex. 1 | 1176.5 |
| Ingredient C described in Ex. 1 | 675.0 |
| Ingredient B described in Ex. 1 | 2160.0 |
| Polyethylene aqueous dispersion (40%) | 562.5 |
| NH₄OH conc. (28%) | 37.8 |
| Distilled water | 1091.2 |
| FC-128 ® described in Ex. 1 | 81.0 |

The quinone diazides were added over 15 minutes to a mechanically stirred solution at 50° C. of all the other components. The resultant solution was filtered through a 10μ filter and extrusion die coated at 30 ft/min (9.14 m/min) on the black layer at 24 mg/dm$^2$ with 105°–112° C. forced air drying in a 32 foot (9.75 m) long dryer. Two minute exposures with a 4 Kw pulsed xenon lamp at a distance of 5 feet (1.52 m) from the film and development at 7 ft/min (2.13 m/min) in a Crona-Lite ® processor described in Example 1 with the developer described in Example 1 gave excellent positive images of good optical density.

EXAMPLE 3

A black coating solution was prepared from the following ingredients: 12 g zinc acetylacetonate was slowly added to a solution of:

| Ingredient | Amount (g) |
| --- | --- |
| Methylene chloride | 3,276.0 |
| Methanol | 340.0 |
| Ethyl Cellosolve | 240.0 |
| Tetraethyleneglycol bis(2-diazo-1-naphthol-5-sulfonate) | 240.0 |
| FC430 ® described in Example 1, 10% methylene chloride solution | 14.8 |
| Polyethylene oxide described in Example 1 in 100 g ethyl Cellosolve | 12.0 |

The solution was slowly added to 3,792 g of a 25% methylene chloride solution of the dispersion of carbon black/terpolymer described in Example 1. The solution was extrusion die coated at 100 ft/min (30.48 m/min) on resin subbed polyethylene terephthalate with 93° C. forced air drying in a 32 foot (9.75 m) long dryer to give a dry weight of 31.6 mg/dm$^2$. The optical density in the regions of the spectrum were: 3.16 visible, 3.5 ultraviolet.

A clear coating solution was prepared from the following ingredients:

| Ingredient | Amount (g) |
| --- | --- |
| Tetraethyleneglycol bis (2-diazo-1-naphthol-5-sulfonate) | 360.0 |
| Methyl methacrylate (92)/methacrylic acid (8) copolymer, acid No. 59, Mw 70,000, 24.92% solids in methylene chloride (90) methanol (5)/ethyl Cellosolve (5) | 541.7 |
| Ingredient C described in Example 1 | 180.0 |
| Ingredient B described in Example 1 | 225.0 |
| Methylene chloride | 4590.0 |
| Methanol | 255.0 |
| Ethyl Cellosolve | 255.0 |

The above clear coating solution was diluted to 12% solids with methylene chloride (90)/methanol (5)/ethyl Cellosolve (5). A mixture of 26.25 g polyethylene oxide as described in Example 1 in 200 g ethyl Cellosolve was added. The solution was extrusion die coated at 60 ft/min (18.29 m/min) with 66° C. forced air drying in a 32 foot (9.75 m) long dryer on top of the black layer at 32.8 mg/dm$^2$. Two minute exposure with a 4 Kw pulsed xenon lamp used in Example 1 and development at 6 ft/min (1.83 m/min) in the Crona-Lite ® processor described in Example 1 gave a positive reproduction of the original artwork.

EXAMPLE 4

A black coating solution was prepared from the following ingredients:

| Ingredient | Amount (g) |
| --- | --- |
| Butyl carbitol 2-diazo-1-naphthol-5-sulfonate | 0.444 |
| Carbon black/terpolymer dispersion described in Ex. 1 | 10.655 |
| Methylene chloride | 39.34 |

The black coating solution was coated on resin subbed polyethylene terephthalate film with a 0.010 inch (0.25 mm) doctor knife to give, after drying at 100° C. for one minute in a forced draft oven, a 0.00125 inch (0.0312 mm) thick coating of 447 mg/dm$^2$.

A clear coating solution was prepared by mixing the following ingredients:

| | Ingredient | Amount (g) |
| --- | --- | --- |
| A | Solution of methyl methacrylate (92)/methacrylic acid (8) copolymer, acid No. 60, Mw 70,000 | 5.45 |
| B | Solution of ethyl acrylate (56)/methyl methacrylate (37)/acrylic acid (7) terpolymer, acid No. 60–65 | 3.13 |
| C | Solution of styrene/maleic anhydride, Ratio 1.4:1 copolymer esterified with a butanol mixture, acid No. 190 | 10.0 |
| | Polyethylene aqueous dispersion (40%) | 2.6 |
| | Zinc crosslink solution as prepared in Example 1 | 0.05 ml |

Ingredient A was prepared by dissolving 270 g of ca. 44% solids ethyl Cellosolve copolymer in a solution of 27 ml conc. ammonium hydroxide and 864 ml distilled water at 60° C. to give 9.18% solids.
Ingredient B was prepared by dissolving 135 g of the terpolymer and 40.5 ml conc. ammonium hydroxide in distilled water to bring weight to 675 g.
Ingredient C was prepared by dissolving 216 g of the copolymer and 64.8 ml conc. ammonium hydroxide in distilled water to bring weight to 2160 g.

To the solution was added at 50° C. with stirring 2 drops conc. ammonium hydroxide solution and 1 g of 2,4-dihydroxybenzoic acid bis(2-diazo-1-naphthol-5-sulfonate) followed by 0.36 g of 5% aq. FC-128 ® solution described in Example 1. The solution was coated with a 0.001 inch (0.025 mm) doctor knife on the dry black layer with heat gun drying followed by 5 minutes in a 105° C. forced draft oven. 30 Unit exposures with a 2 Kw Mercury photopolymer Berkey lamp followed by development for 30 seconds in the developer described in Example 1 gave a positive √2 stepwedge image of 3 clear √2 steps.

EXAMPLES 5 AND 6

A black coating solution was prepared from the following ingredients:

| Ingredient | Amount (g) |
| --- | --- |
| Butyl carbitol 2-diazo-1 | 2.666 |

| Ingredient | Amount (g) |
|---|---|
| naphthol-5-sulfonate | |
| Carbon black/terpolymer dispersion described in Ex. 1 | 10.655 |
| Methylene chloride | 30.0 |

The carbon black solution was coated with a 0.001 inch (0.025 mm) doctor knife on resin subbed polyethylene terephthalate, air dried and dried for one minute in a 100° C. forced draft oven to give coatings of 43.6 mg/dm².

Clear coating solutions were prepared by mixing the following ingredients:

| | Amount | |
|---|---|---|
| Ingredient | Example 5 g | Example 6 g |
| Quinone diazide* | 0.1 | 0.8 |
| Methyl methacrylate(92)/ methacrylic acid (8) copolymer acid No. 59, described in Example 3 | 0.15 | 0.15 |
| Ingredient B described in Example 1 | 0.75 | 0.05 |
| Methylene chloride | 8.74 | 5.18 |
| Methanol | 0.43 | 0.03 |
| Dimethylformamide | — | 0.25 |

*Epon ® 828 ring opened with phenol and esterified to 47% with 2-diazo-1-naphthol-5-sulfonyl chloride.

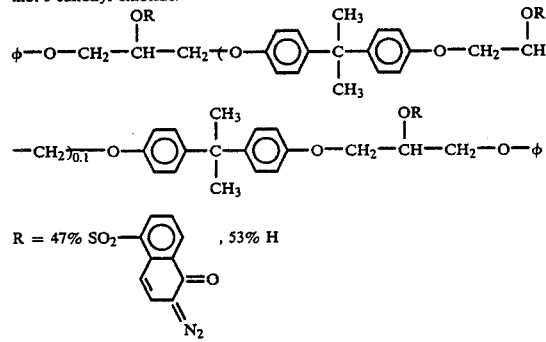

The clear solutions were coated directly on the dry carbon black coatings with a 0.0005 inch (0.013 mm) doctor) knife with solvent flashed off with a heat gun and the films dried for one minute in a 100° C. forced draft oven. Coating weight of the clear layer of Example 5 was 19.9 mg/dm² and Example 6 was 25.7 mg/dm².

Both films were exposed 60 units with a 2 Kw Mercury photopolymer Berkey lamp through a Du Pont $\sqrt[3]{2}$ transmission gray scale stepwedge.

Example 5 was developed for 25 seconds in the developer described in Example 1 at 22° C. followed by spray water rinsing at 40 psi, (2.81 kg/sq cm), 32° C. to yield a positive stepwedge image of one clear $\sqrt[3]{2}$ step that did not contain any background.

Example 6 was developed in a solution of 1.86% sodium carbonate and 11.32% butyl carbitol in distilled water for 12 seconds at 22° C. followed by spray water rinsing at 40 psi (2.81 kg/sq cm), 32° C. to yield one clear $\sqrt[3]{2}$ step on a positive stepwedge image.

EXAMPLES 7 TO 10

Clear coating solutions were prepared by mixing the following ingredients:

| | Example Amount (g) | | | |
|---|---|---|---|---|
| Ingredient | 7 | 8 | 9 | 10 |
| Quinone diazide* | 0.25 | 0.25 | 0.25 | 0.25 |
| Ingredient C described in Example 1 | 0.10 | 0.10 | 0.10 | 0.10 |
| Ingredient B described in Example 1 | 0.50 | 0.50 | 0.50 | 0.50 |
| Methylmethacrylate (30)/ butadiene (25)/methacrylic acid (15)/acrylonitrile (30) tetrapolymer, acid No. 105, Mw 150,000 | 0.15 | — | — | — |
| (83) Vinyl chloride (86)/ vinyl acetate (16)/ maleic acid (1), acid No. 11 | — | 0.15 | — | — |
| Vinyl chloride (81)/ vinyl acetate (17)/ maleic acid (2) Acid No. 26 | — | — | 0.15 | — |
| Vinyl acetate/95 crotonic acid (5) acid No. 38. Mw > 30,000 | — | — | — | 0.15 |
| Methylene chloride | 7.72 | 7.72 | 7.72 | 7.72 |
| Dimethylformamide | 0.20 | 0.60 | 0.60 | 0.40 |
| Methanol | 0.26 | 0.26 | 0.26 | 0.26 |

*Quinone diazide is Epon ® 828 ring opened with phenol and esterified 50% with 2-diazo-1-naphthol-5-sulfonyl chloride.

The carbon black solutions described in Examples 5 and 6 were coated as described therein.

The clear solutions were coated on the dry black layer as described in Examples 5 and 6 to give a clear layer coating weight of 16.6 mg/dm². The films after being placed in vacuum frames were exposed 30 units with a 2 Kw mercury photopolymer Berkey lamp 38 inches (0.96 meter) from the vacuum frames. Upon development as described in Example 1 for the time period set forth in Table 1 the indicated number of clear $\sqrt[3]{2}$ stepwedge images were achieved.

TABLE 1

| Example | Development Time (sec) | # Clear $\sqrt[3]{2}$ Stepwedge Image |
|---|---|---|
| 7 | 12 | 1 |
| 8 | 4 | 1 |
| 9 | 5 | 1 |
| 10 | 5 | 2 |

EXAMPLES 11 TO 14

These examples illustrate the use of other type polymers and the preparation of the litho film by lamination. Examples 11, 12 and 14 are control examples.

Clear solutions were prepared by mixing the following ingredients in the amounts indicated.

| | Example Amount (g) | | | |
|---|---|---|---|---|
| Ingredient | 11 | 12 | 13 | 14 |
| Butyl carbitol 2-diazo-1-naphthol-5-sulfonate | 0.40 | 0.35 | 0.35 | 0.40 |
| Ingredient C described in Example 1 | 0.05 | 0.10 | 0.10 | 0.10 |
| Ingredient B described in Example 1 | 0.40 | 0.40 | 0.40 | — |

-continued

| Ingredient | Example Amount (g) | | | |
|---|---|---|---|---|
| | 11 | 12 | 13 | 14 |
| Styrene/maleic anhydride, ratio 1:1 esterified with a butanol mixture, acid No. 180, Mw 20,000 | — | — | — | 0.25 |
| Anoval ® PN-430, phenol/-formaldehyde resin from American Hoechst | 0.15 | — | — | 0.10 |
| Methyl methacrylate (69)/n-butyl methacrylate (29)/ methacrylic acid (2) terpolymer, acid No. 5, Mw 25,000, Tg 74° C. | — | 0.10 | — | — |
| Methyl methacrylate (98)/ methacrylic acid (2) copolymer, acid No. 9 Mw 25,000, Tg 106° C. | — | — | 0.10 | — |
| Methyl methacrylate (92)/ methacrylic acid (8) copolymer, acid No. 59, described in Ex. 3 | — | — | — | 0.15 |
| Methylene chloride | 5.27 | 5.80 | 4.53 | 5.36 |
| Methanol | 0.44 | 0.35 | 0.29 | 0.30 |

The clear solutions of Examples 11 to 14 were coated with a 0.0005 inch (0.013 mm) doctor knife on 0.001 inch (0.025 mm) polyethylene terephthalate film, air dried and laminated, to a carbon black layer at 190°–200° F. (88°–93° C.) at 2 ft/min (60.96 cm/min), 40 psi (2.81 kg/sq cm). The carbon black coating for Examples 11, 12 and 14 was an extrusion die coating of a roll mill dispersion of carbon black/terpolymer described in Example 1 on resin subbed polyethylene terphthalate with a coating weight of 28.9 mg/dm². The carbon black coating for Example 13 was a doctor knife coating of a solution of 26.72 g butyl carbitol 2-diazo-1-naphthol-5-sulfonate, 26.72 g ingredient C described in Example 1, 1.34 g zinc acetate, 93.52 g of a 45/55 roll milled dispersion of carbon black/terpolymer described in Example 1, 1108 g methylene chloride and 80 g methanol to give coatings of 40 mg/dm².

The films were exposed with a 2 Kw Hg photopolymer Berkey Askor vacuum printer, and developed in the developer described in Example 1 to yield positive images. The indicated number of clear $\sqrt[3]{2}$ stepwedge images achieved are set forth in Table 2.

TABLE 2

| Ex. | Exposure (units) | Development Time (sec) | # Clear $\sqrt[3]{2}$ Stepwedge Images | Coating Weight Clear Layer (mg/dm²) |
|---|---|---|---|---|
| 11 | 30 | 8 | 2 | 20.0 |
| | 30 | 9 | 3 | |
| | 30 | 10 | 3 | |
| 12 | 60 | 2 | 7 | 17.5 |
| 13 | 30 | 4 | 1 | 20.0 |
| 14 | 30 | 12 | 4 | 20.0 |

Films of control Examples 11, 12 and 14 had reduced shelf life due to migration of the quinone diazide into the black layer. The presence of quinone diazide in the black layer provides film of this invention that are useful as litho films.

EXAMPLE 15

A black coating solution was prepared from the following ingredients:

| Ingredient | Amount (g) |
|---|---|
| Carbon black/terpolymer dispersion described in Ex. 1 | 1.7935 |
| Ingredient C described in Example 1 | 0.2562 |
| Butyl carbitol 2-diazo-1-naphthol-5-sulfonate | 0.5124 |
| Methylene chloride | 8.2 |

The solution was coated with a 0.001 inch (0.025 mm) doctor knife on resin subbed polyethylene terephthalate film and the air dried layer of a clear coating was laminated thereon as described in Example 11. The clear coating solution was coated with the aforementioned doctor knife on 0.001 inch (0.025 mm) polypropylene and air dried for 1 minute in a 100° C. forced draft oven. The clear coating solution was prepared as follows:

| Ingredient | Amount (g) |
|---|---|
| Butyl carbitol 2-diazo-1-naphthol-5-sulfonate | 0.40 |
| Ingredient C described in Example 1 | 0.05 |
| Ingredient B described in Example 1 | 0.35 |
| Methyl methacrylate (92)/ methacrylic acid (8) copolymer, acid No. 59, described in Example 3 | 0.20 |
| Methylene chloride | 3.85 |
| Methanol | 0.18 |

The film was exposed for 30 units with the same exposure source described in Example 1 and developed for 7 seconds at 22° C. with the developer described in Example 1 to yield 4 clear no density steps on a positive $\sqrt[3]{2}$ stepwedge image.

EXAMPLE 16

This is a control example. 10 g of Shipley AZ-1350J quinone diazide resist solution was mixed with 6 g ingredient C described in Example 1 and 16 g methylene chloride and coated with a 0.0001 inch/0.0025 mm) doctor knife on a carbon black coating prepared as described in Examples 11 to 14. Exposure for 10 units with the exposure source described in Example 11 followed by 7 seconds development in a 3% solids solution of 9:1 sodium carbonate/sodium bicarbonate at 22° C. and water rinsing gave a positive $\sqrt[3]{2}$ stepwedge image of one no density step. This is a control since it contains no quinone diazide compound in the carbon black coating. Results were obtained because the element was used immediately after preparation.

I claim:

1. A multilayer photosolubilizable litho element comprising, in order on a support, (1) a photosolubilizable solvent-soluble dye or pigment-containing layer, 0.0025 to 0.0064 mm in thickness, comprising at least one photosolubilizable quinone diazide compound in an amount of 4 to 40% by weight based on the dry weight of the layer, at least one acidic polymeric binder in an amount of 20 to 60% by weight based on the dry weight of the layer, and dye or pigment in an amount up to 50% by weight based on the dry weight of the layer, the layer having an optical density of at least 2.0 in the ultraviolet region of the spectrum, and (2) a clear photosolubilizable layer, 0.0013 to 0.005 mm in thickness, comprising 10 to 80% by weight based on the dry weight of layer of at least one photosolubilizable quinone diazide compound, and 20 to 90% by weight based on the dry weight of the layer of at least two polymeric binders having carboxylic acid substituents, one of said binders having an acid number below 110 and any other binder having an acid number below 300.

2. An element according to claim 1 wherein the quinone diazide compounds may be the same or different in each layer and are esters or amides of 2-diazo-1-naphthol-5-sulfonic acid.

3. An element according to claim 1 wherein the quinone diazide compounds are taken from the group consisting of butyl carbitol 2-diazo-1-naphthol-5-sulfonate, 2,4-dihydroxybenzoic acid bis(2-diazo-1-naphthol-5-sulfonate), 3,5-dihydroxybenzoic acid bis(2-diazo-1-naphthol-5-sulfonate), and tetraethylene-glycol bis(2-diazo-1-naphthol-5-sulfonate).

4. An element according to claim 2 wherein the quinone diazide compound in layer (1) is butyl carbitol 2-diazo-1-naphthol-5-sulfonate and in layer (2) is 2,4-dihydroxybenzoic acid bis(2-diazo-1-naphthol-5-sulfonate).

5. An element according to claim 1 wherein layer (1) contains carbon black as a pigment.

6. An element according to claim 1 wherein the polymeric binder of layer (1) is ethyl acrylate/methyl methacrylate/acrylic acid.

7. An element according to claim 6 wherein polymeric binders in layer (2) are poly(methylmethacrylate/methacrylic acid), styrene/maleic anhydride copolymer esterified with butanol mixture, and ethyl acrylate/methyl methacrylate/acrylic acid copolymer.

8. An element according to claim 7 wherein layer (1) comprises 10 to 20 parts by weight of quinone diazide compound and 80 to 90 parts by weight of a mixture of dye or pigment and said terpolymer, and layer (2) comprises 20 to 40 parts by weight of quinone diazide compound, 40 to 50 parts by weight of said styrene/maleic anhydride copolymer esterified with a butanol mixture, 5 to 20 parts by weight of ethyl acrylate/methyl methacrylate/acrylic acid copolymer, and 10 to 20 parts by weight of poly(methylmethacrylate/methacrylic acid).

9. An element according to claim 1 having an optical density of at least 2.0 in the visible region of the spectrum.

* * * * *